United States Patent
Sakurada et al.

(10) Patent No.: US 11,486,833 B2
(45) Date of Patent: Nov. 1, 2022

(54) METHOD FOR EVALUATING EDGE SHAPE OF SILICON WAFER, APPARATUS FOR EVALUATING THEREOF, SILICON WAFER, METHOD FOR SELECTING AND METHOD FOR MANUFACTURING THEREOF

(71) Applicant: SHIN-ETSU HANDOTAI CO., LTD., Tokyo (JP)

(72) Inventors: Masahiro Sakurada, Annaka (JP);
Makoto Kobayashi, Annaka (JP);
Takeshi Kobayashi, Annaka (JP);
Koichi Kanaya, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 293 days.

(21) Appl. No.: 16/636,066

(22) PCT Filed: Jul. 27, 2018

(86) PCT No.: PCT/JP2018/028167
§ 371 (c)(1),
(2) Date: Feb. 3, 2020

(87) PCT Pub. No.: WO2019/035336
PCT Pub. Date: Feb. 21, 2019

(65) Prior Publication Data
US 2020/0240929 A1   Jul. 30, 2020

(30) Foreign Application Priority Data

Aug. 15, 2017 (JP) .............................. JP2017-156723
Oct. 11, 2017 (JP) .............................. JP2017-197880

(51) Int. Cl.
H01L 21/66 (2006.01)
G01N 21/95 (2006.01)
B24B 9/06 (2006.01)
H01L 21/02 (2006.01)

(52) U.S. Cl.
CPC ......... *G01N 21/9503* (2013.01); *B24B 9/065* (2013.01); *H01L 21/02021* (2013.01); *H01L 22/12* (2013.01)

(58) Field of Classification Search
CPC ................ G01N 21/9503; B24B 9/065; H01L 21/02021; H01L 22/12; H01L 21/304; G01B 11/24; G01B 2210/56
See application file for complete search history.

(56) References Cited

U.S. PATENT DOCUMENTS

2009/0170406 A1   7/2009 Kato
2009/0324896 A1   12/2009 Kato
(Continued)

FOREIGN PATENT DOCUMENTS

EP   2 033 739 A1   3/2009
EP   3 089 202 A1   11/2016
(Continued)

OTHER PUBLICATIONS

May 19, 2020 Office Action issued in Japanese Patent Application No. 2017-197880.
(Continued)

Primary Examiner — Cuong B Nguyen
(74) Attorney, Agent, or Firm — Oliff PLC

(57) ABSTRACT

A method evaluates an edge shape of a silicon wafer, in which as shape parameters in a wafer cross section, when defining a radial direction reference L1, a radial direction reference L2, an intersection point P1, a height reference plane L3, h1 [μm], h2 [μm], a point Px3, a straight line Lx, an angle θx, a point Px0, δ [μm], a point Px1, and a radius Rx [μm], the edge shape of the silicon wafer is measured, values of the shape parameters h1, h2, and δ are set, the shape parameters Rx and θx are calculated in accordance with the definition based on measurement data of the edge (Continued)

shape, and the edge shape of the silicon wafer is determined from the calculated Rx and θx to be evaluated. Consequently, a method evaluates an edge shape of a silicon wafer capable of preventing an occurrence of trouble.

10 Claims, 10 Drawing Sheets

(56) References Cited

U.S. PATENT DOCUMENTS

2014/0008768 A1    1/2014  Sato
2016/0314577 A1   10/2016  Lee et al.

FOREIGN PATENT DOCUMENTS

| | | |
|---|---|---|
| JP | 2009-168634 A | 7/2009 |
| JP | 2009-222516 A | 10/2009 |
| JP | 2016-203342 A | 12/2016 |
| WO | 2008/093488 A1 | 8/2008 |
| WO | 2012/147279 A1 | 11/2012 |

OTHER PUBLICATIONS

Semi M73-0309: Test Methods for Extracting Relevant Characteristics From Measured Wafer Edge Profiles, Semi, 3081 Zaner Road, San Jose, CA, 95134, USA, XP40460781A.
Mar. 25, 2021 Extended European Report issued in European Patent Application No. 18846345.9.
Sep. 4, 2018 International Search Report issued in International Patent Application No. PCT/JP2018/028167.

[FIG. 1]
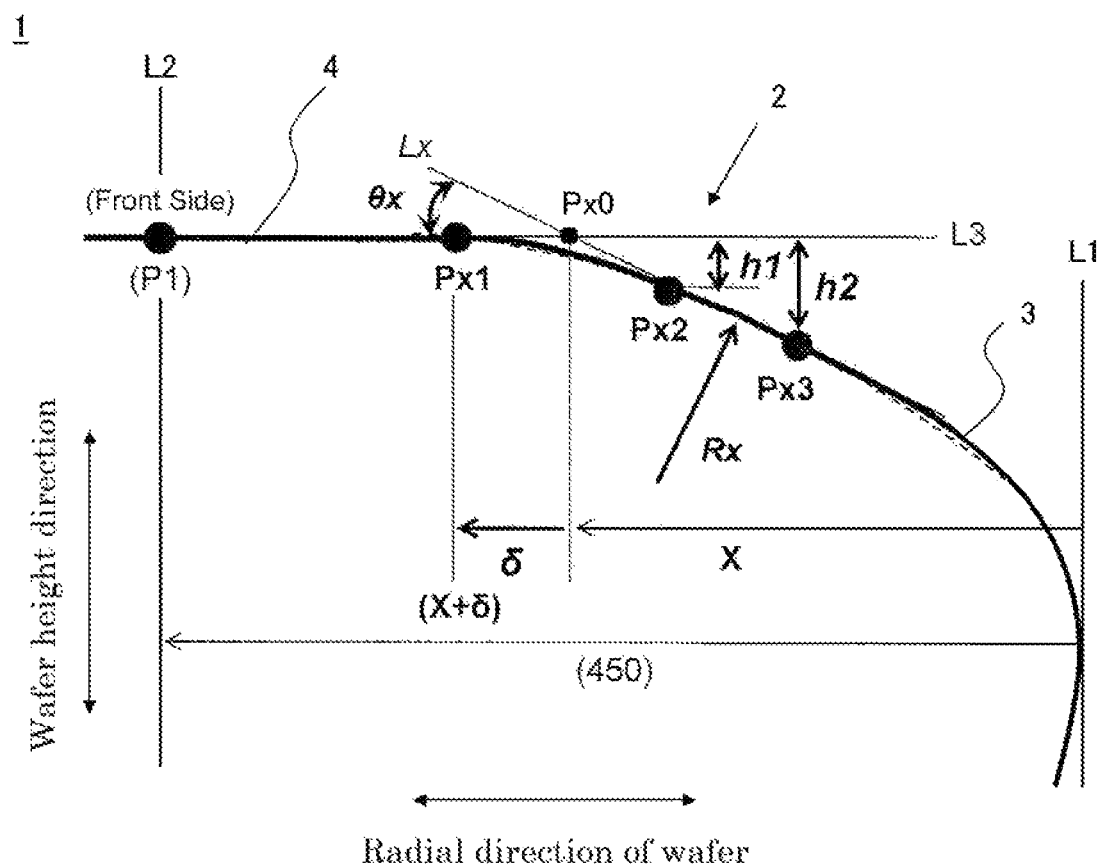

[FIG. 2]
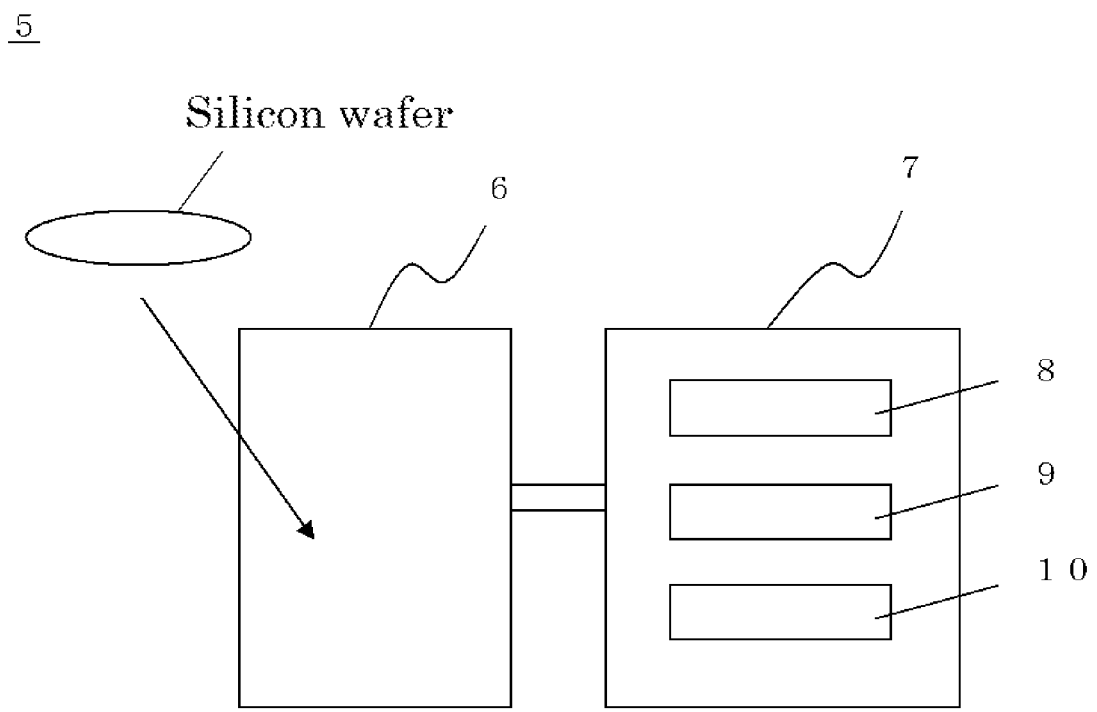

[FIG. 3]
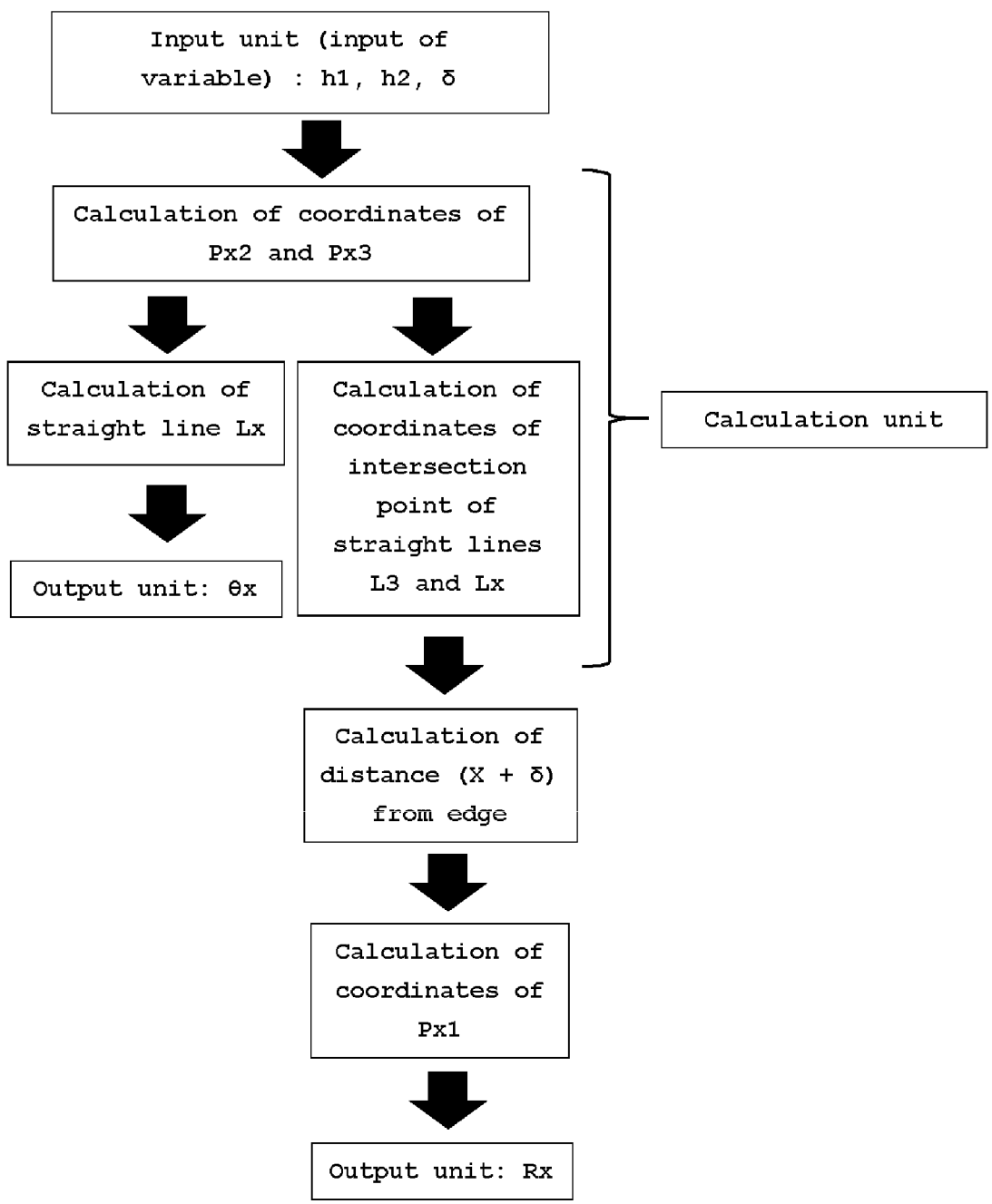

[FIG. 4]
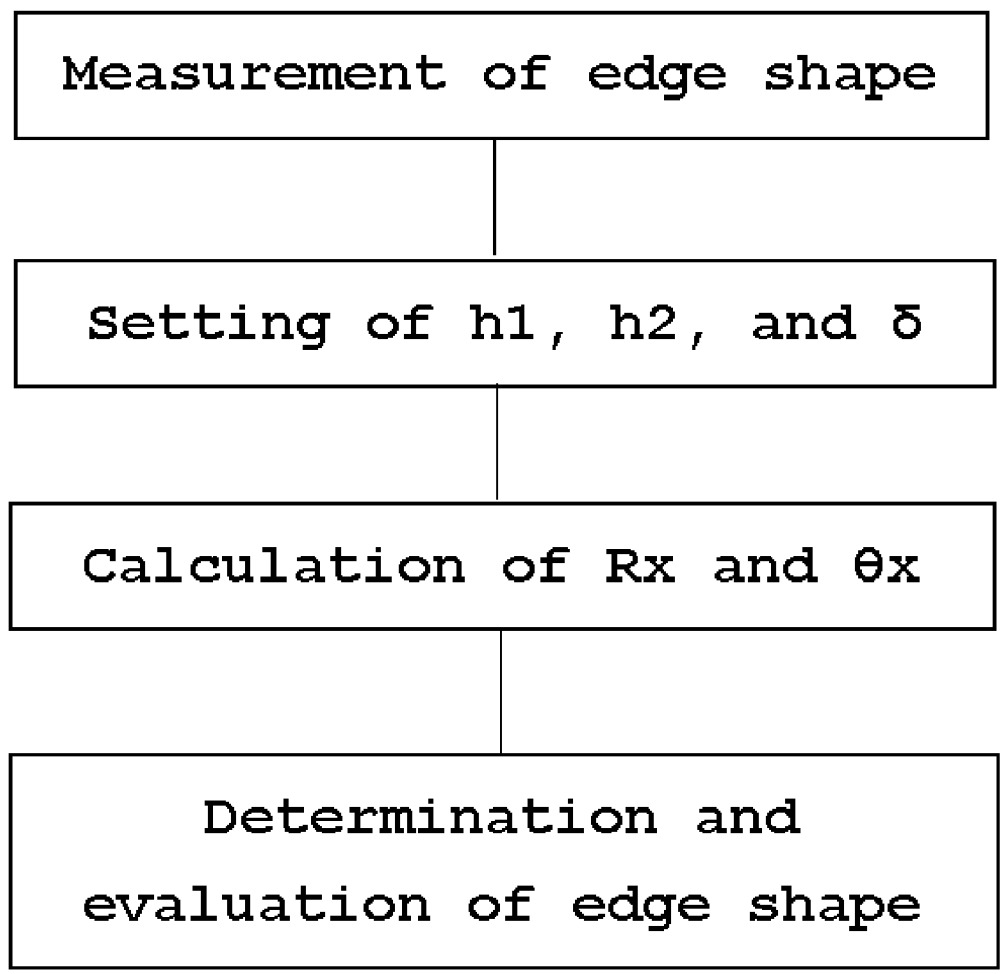

[FIG. 5]
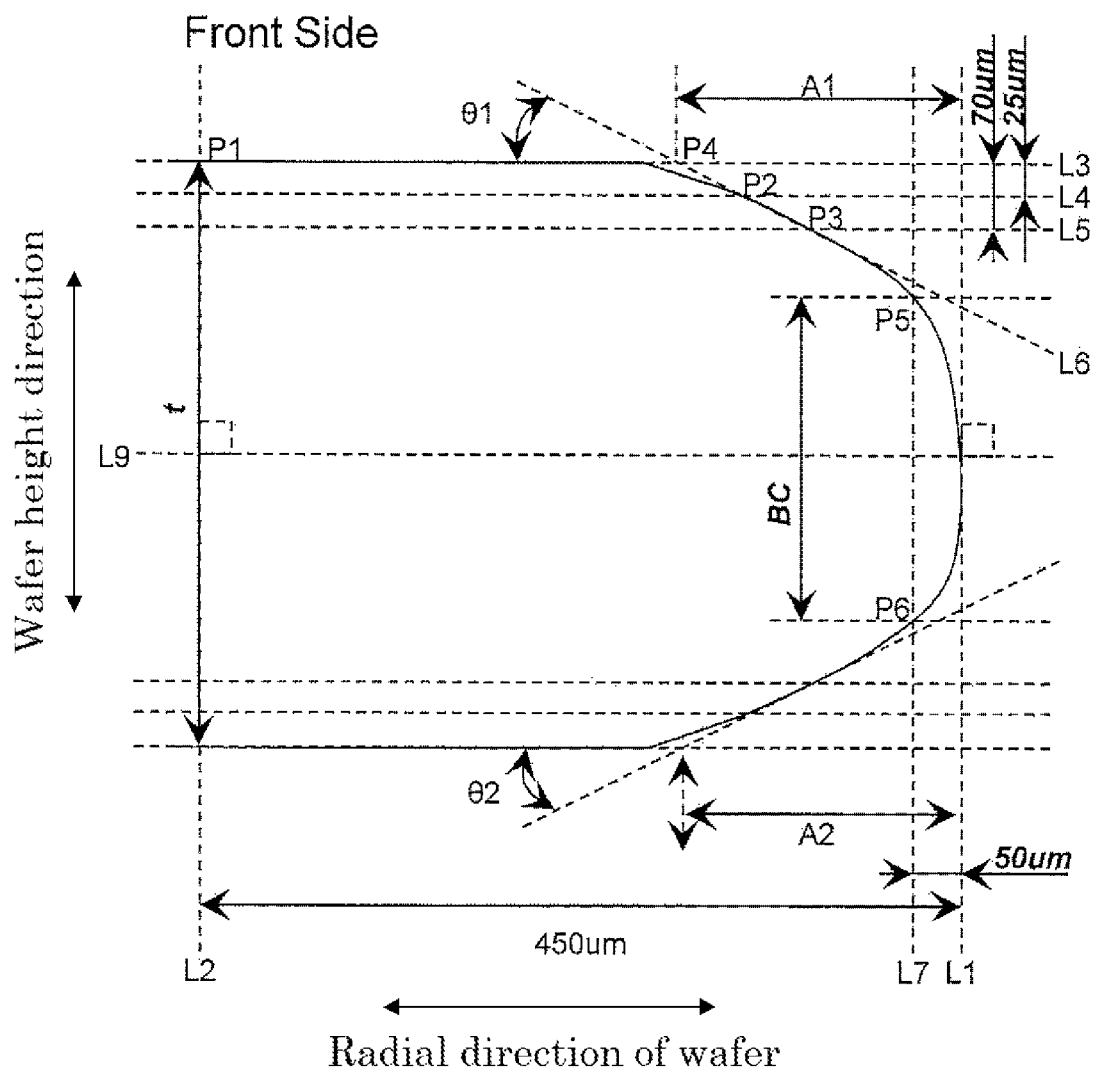

[FIG. 6]
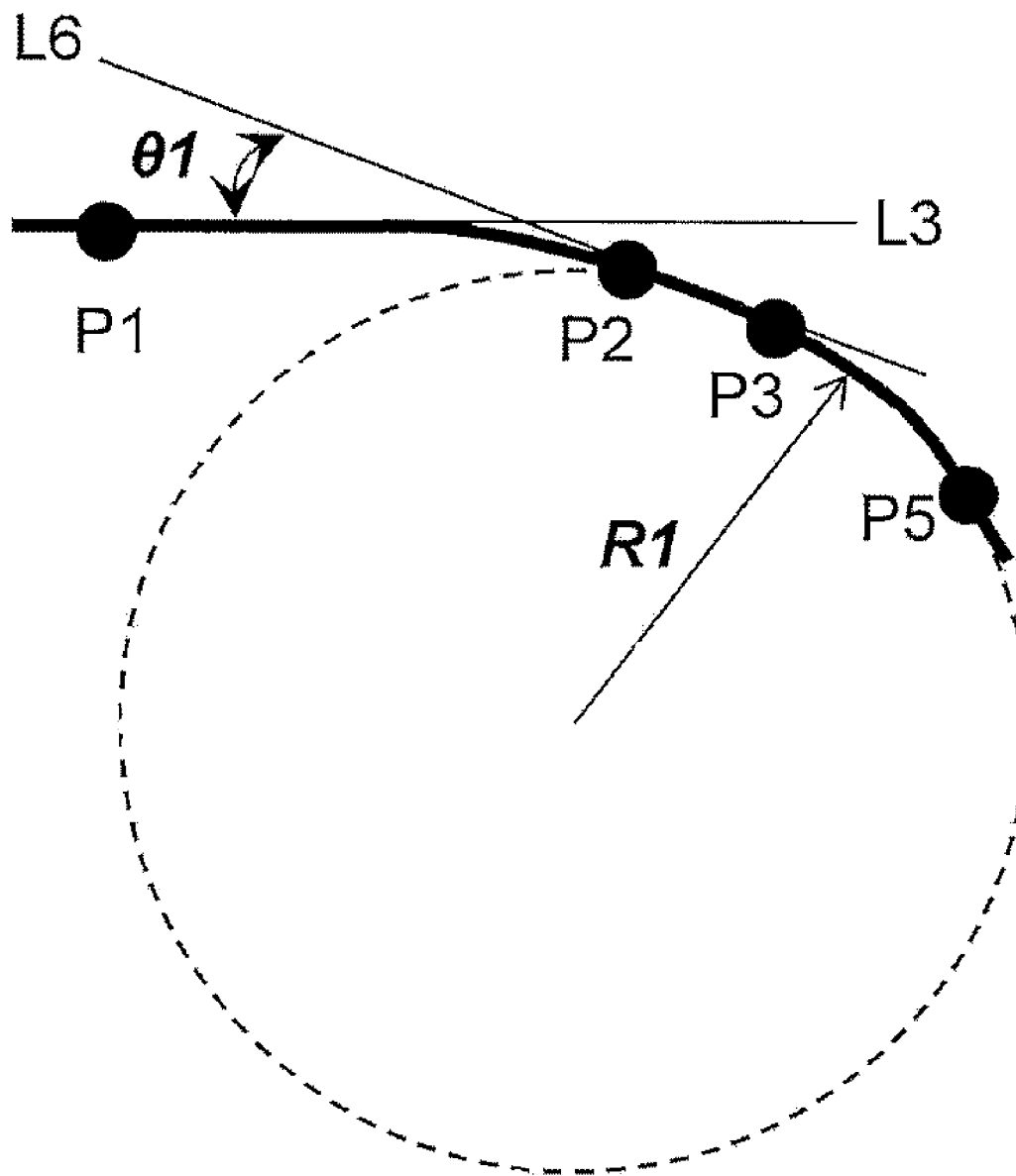

[FIG. 7]
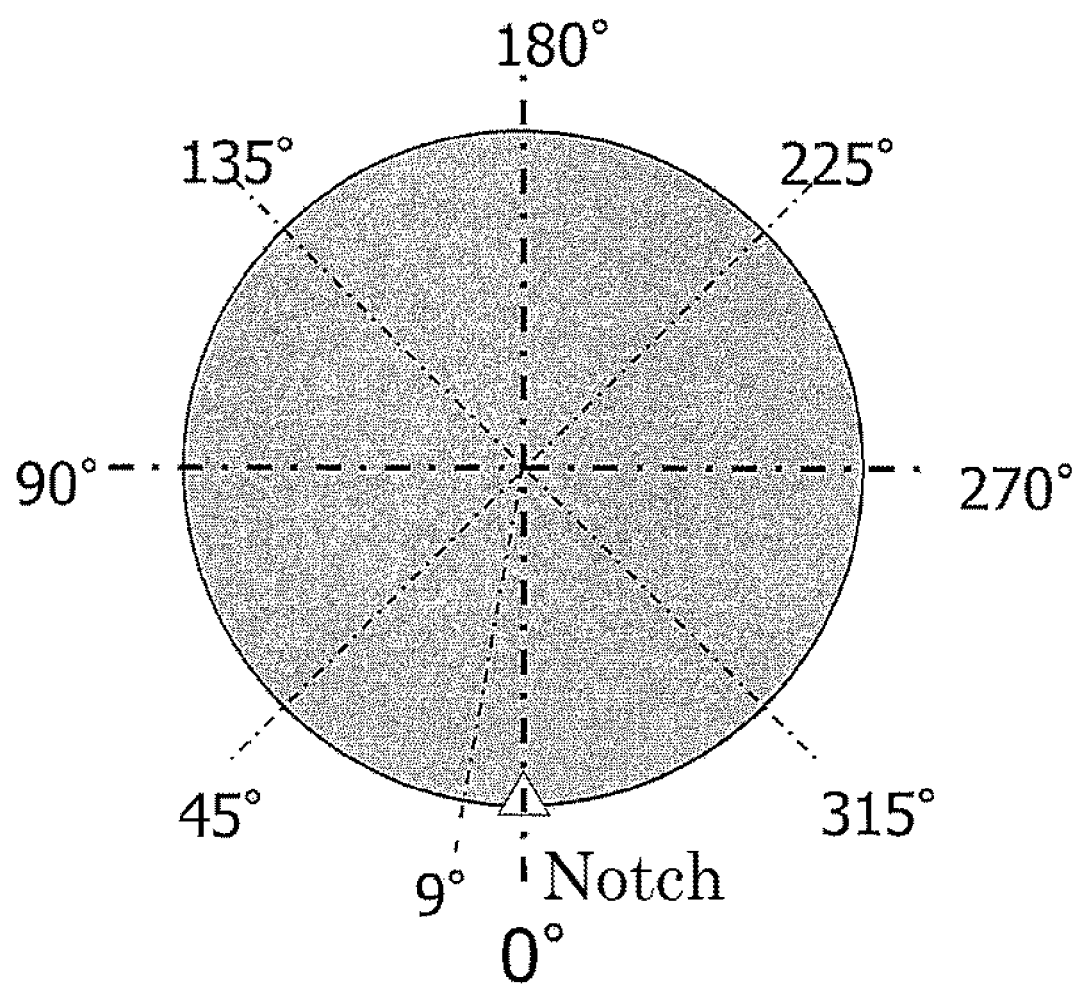

[FIG. 8]
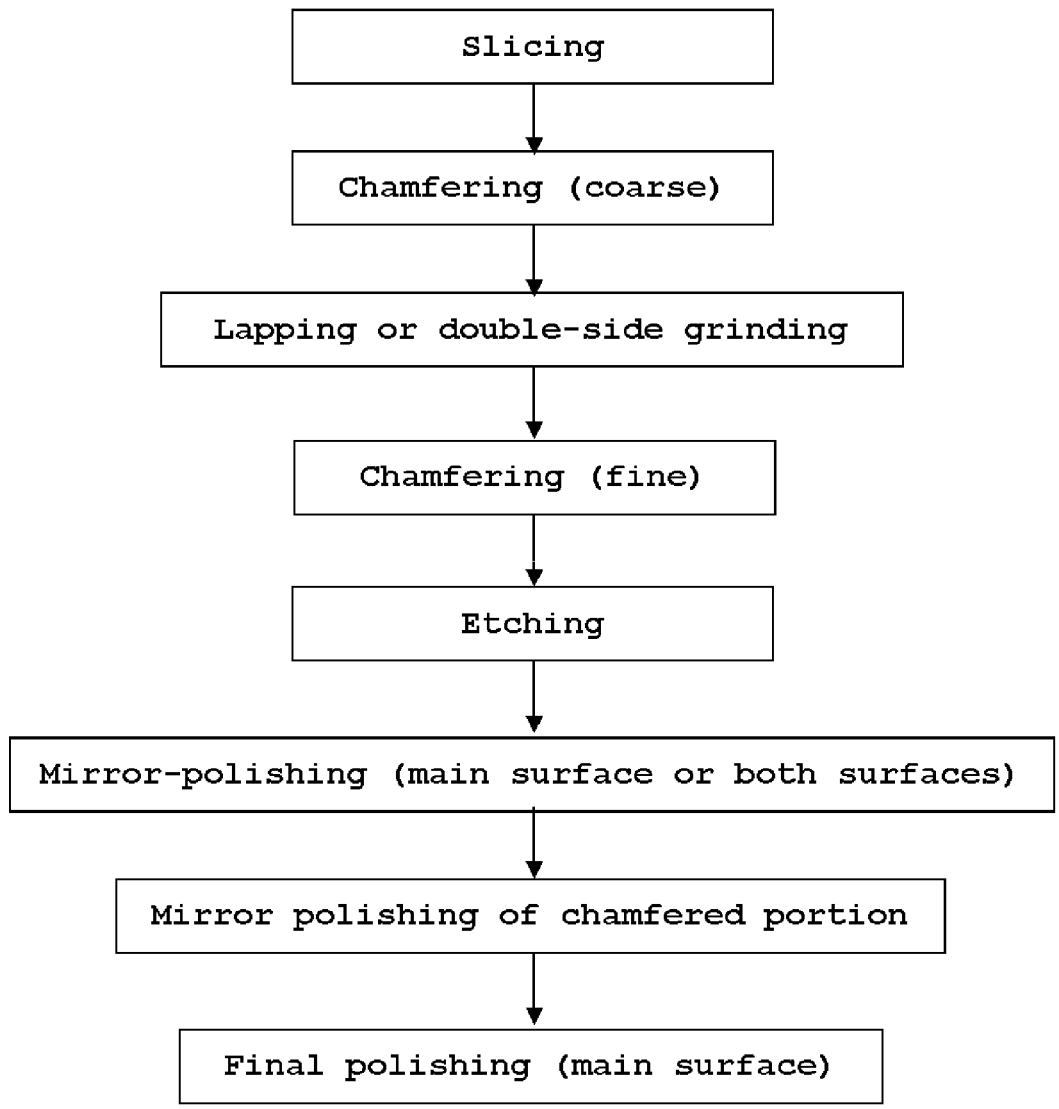

[FIG. 9]
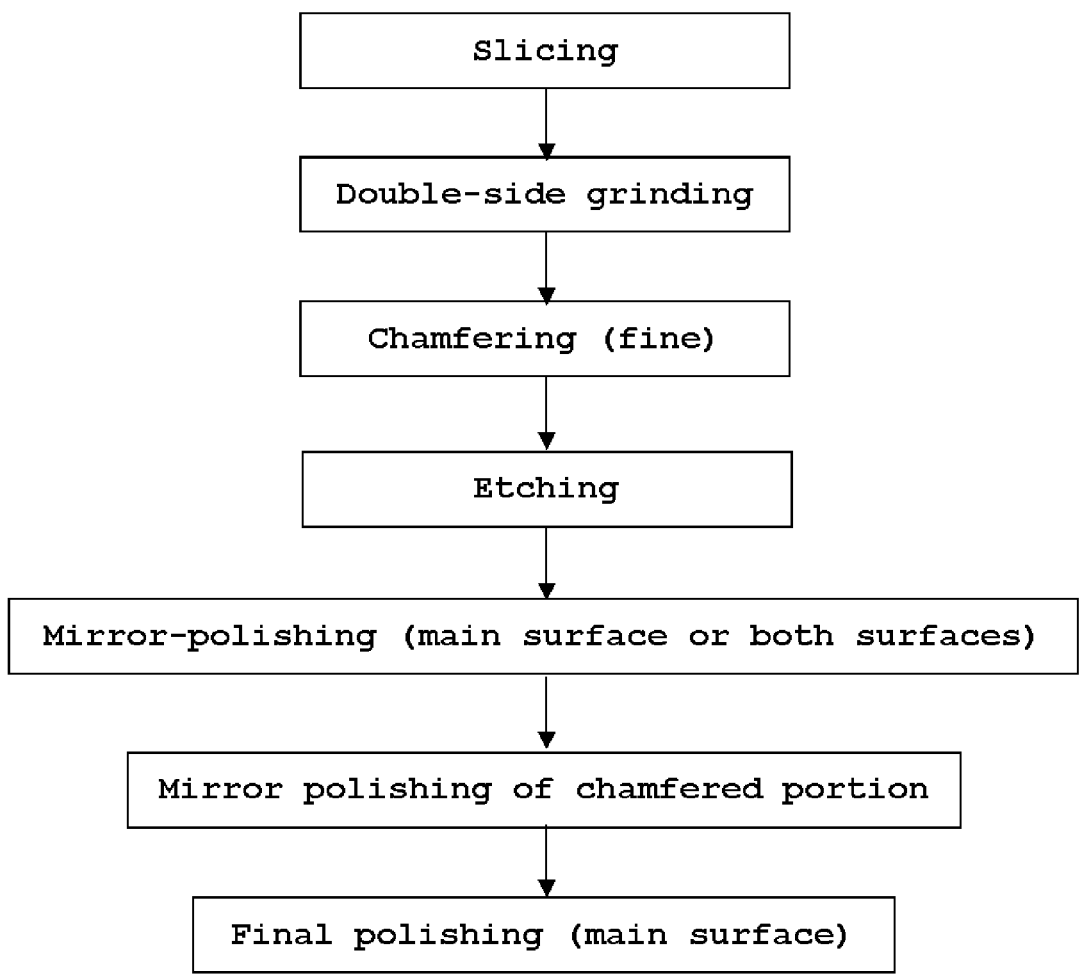

[FIG. 10]
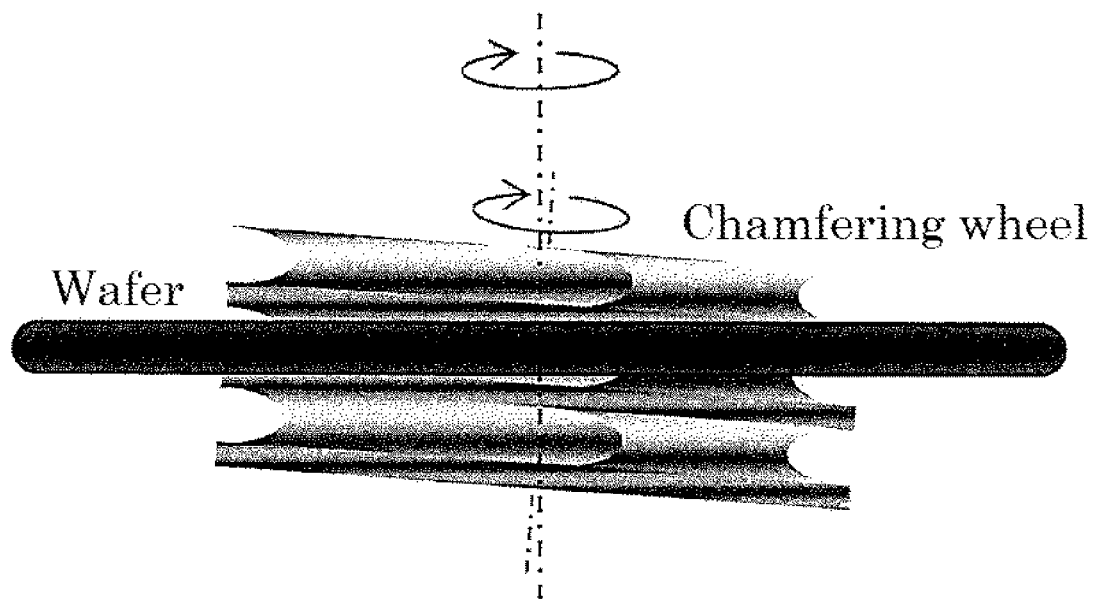
[FIG. 11]
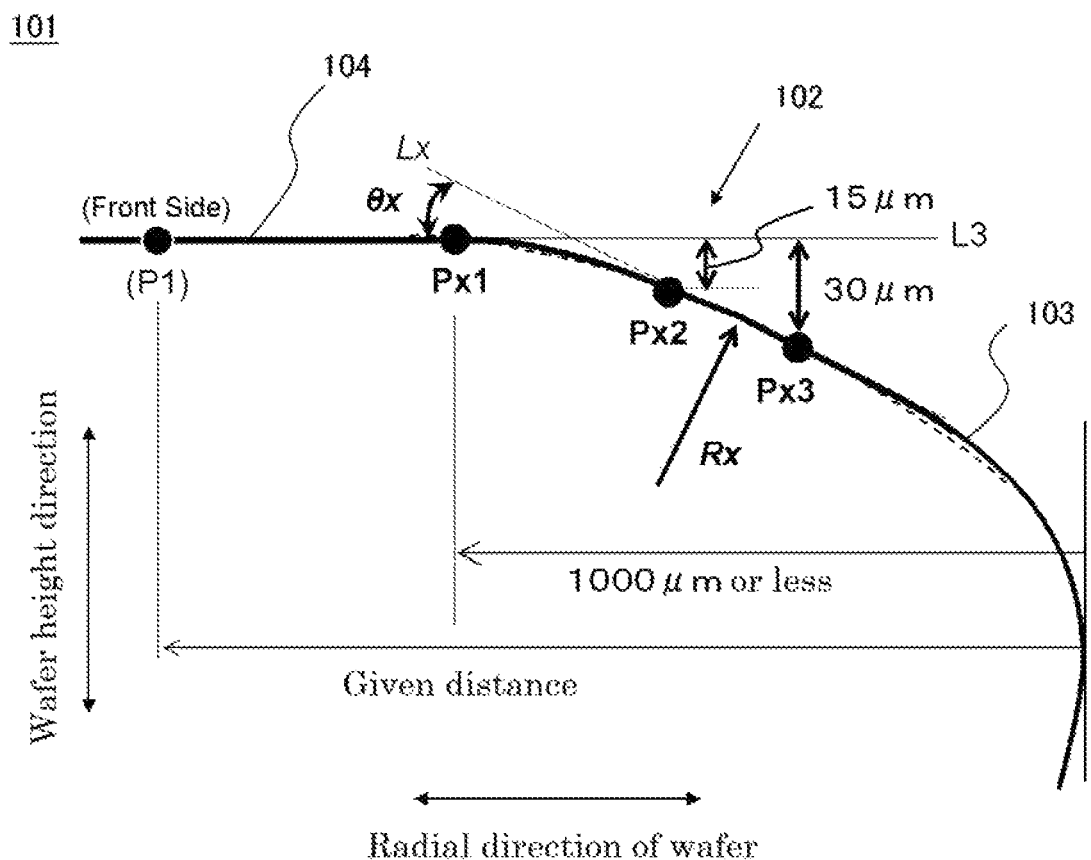

METHOD FOR EVALUATING EDGE SHAPE OF SILICON WAFER, APPARATUS FOR EVALUATING THEREOF, SILICON WAFER, METHOD FOR SELECTING AND METHOD FOR MANUFACTURING THEREOF

TECHNICAL FIELD

The present invention relates to: a method for evaluating an edge shape of a silicon wafer, an apparatus for evaluating thereof, a silicon wafer, a method for selecting and a method for manufacturing thereof.

BACKGROUND ART

Dimensions of a cross sectional shape of a chamfered portion of a silicon wafer (hereinafter, also referred to simply as wafer) will be described based on an example of a cross sectional shape of a chamfered portion shown in FIG. 5. Concerning standards for a cross sectional shape of a chamfered portion, dimensions are defined, and they are as follows.

(1) A position in a radial direction of the wafer at a tip (position in a wafer height direction: height reference plane L9) of a chamfered portion is defined as a radial direction reference L1, a position in the radial direction of the wafer 450 μm inward in a central direction of the wafer from the radial direction reference L1 as a radial direction reference L2, an intersection point of the radial direction reference L2 and a main surface of the wafer as P1, and a plane including the point P1 and showing a wafer height position of the point P1 as a height reference plane L3. A straight line that joins, in the chamfered portion, a point P2 (position in the wafer height direction: height reference plane L4) positioned in a distance of 25 μm from the height reference plane L3 and a point P3 (position in the wafer height direction: height reference plane L5) positioned in a distance of 70 μm from the height reference plane L3 parallel to the height reference plane L3 is defined as L6, and an angle between the height reference plane L3 and the straight line L6 as θ1. Similarly, θ2 is defined on a back surface side. Generally, these are called chamfering angles.

(2) An intersection point of the height reference plane L3 and the straight line L6 is defined as P4, and a distance between the point P4 and the radial direction reference L1 as A1. Similarly, A2 is defined on the back surface side. Generally, these are called surface widths.

(3) A distance between a point P5 and a point P6 where a straight line L7 translated by 50 μm in a central direction of the wafer from the radial direction reference L1 at the tip of the chamfered portion and the cross section of the chamfered portion intersect is defined as BC. This is also generally called surface width.

In the above measurement of dimensions, calculation is performed by subjecting an image taken in to binarization image processing by a general transmitted light system. As measuring points, 4 points or 8 points on the wafer surface are generally measured with a notch position as a reference (see FIG. 7, showing an example of the measuring points of the cross sectional shape dimensions of the chamfered portion). When measuring 4 points, the 4 points are at 90° intervals including a point near the notch (for example, a point 9° from the notch). When measuring 8 points, the 8 points are at 45° intervals including a point near the notch (for example, a point 9° from the notch). However, measuring points are not limited thereto. In addition, the point 9° from the notch is set as a measuring point because there is no chamfered portion in the notch portion, and there is no particular limitation to 9°.

Target values (central value of the standards) of the above cross sectional shape parameters of the chamfered portion A1, A2, BC, θ1, or θ2 are each different depending on customers that manufacture devices, but the required value of their variation and standards are becoming stricter every year. The required variation is predicted to be, for example, ±80 μm in a 65-nm node, ±45 μm in a 45-nm node, and ±25 μm or less in a 32-nm node.

It is desirable to make such cross sectional shape dimensions of a chamfered portion uniform, and a silicon wafer is manufactured by such manufacturing steps as those in FIG. 8 and FIG. 9.

Firstly, as shown in FIG. 8, a slicing step of cutting a thin plate wafer out of a single crystal ingot, a chamfering (coarse) step for preventing a peripheral portion of a wafer from being chipped, a lapping step or a double-side grinding step for eliminating the variation of wafer thickness, a chamfering (fine) step, an etching step for removing mechanical damages and contaminants introduced in the lapping or grinding, and a step of mirror-polish processing the chamfered portion of the wafer and the main surface or both surfaces to mirror surfaces are generally performed successively. In particular, in order to accomplish a strict chamfered-shape accuracy, a chamfering process is performed again after the lapping or after grinding the front and back sides.

In addition, recently, a method of performing only one stage of chamfering (fine) after the double-side grinding as shown in FIG. 9 has also been considered for the purpose of reducing a chamfering step. It is to be noted that when a lapping step is performed in the manufacturing method of FIG. 9, a coarse chamfering will be required before lapping.

In the chamfering steps of FIG. 8 and FIG. 9, chamfering is generally performed by pressing a chamfering wheel which has a formed groove against a peripheral portion of the wafer and transferring the shape of the groove to the wafer. A schematic view of an example of a formed chamfering method is shown in FIG. 10. Since the wheel rotates at high speed and the wafer also rotates, a uniform chamfered shape can be transferred in a circumferential direction of the wafer.

Incidentally, there are various methods for measuring such an edge shape, and for example, a method disclosed in Patent Document 1 is possible.

CITATION LIST

Patent Literature

Patent Document 1: Japanese Unexamined Patent Application Publication No. 2009-168634

SUMMARY OF INVENTION

Technical Problem

Incidentally, in an advanced device process which adopts a large-diameter silicon wafer, for example, represented by those with a diameter of 300 mm, before going through exposure process, there is a step of applying photoresist by, for example, spin coater method. However, when introducing a silicon wafer manufactured by and whose shape was evaluated by a conventional technology into a device process, a swelling occurs in the photoresist at an edge portion of the silicon wafer, and the photoresist film may be burst after photoresist curing, and the process and the wafer may be contaminated.

In addition, for example, in a nitride film formation process after formation of an oxide film, oxide film delamination may occur after curing of the oxide film, and the process and the wafer may become contaminated.

In addition, when setting the silicon wafer in a manufacturing apparatus during the device process, poor detection of the wafer edge portion by a positioning sensor may be caused.

The present invention has been made in view of the above-described problem, and an object of the present invention is to provide a method for evaluating an edge shape of a silicon wafer, an apparatus for evaluating thereof, a silicon wafer, a method for selecting and a method for manufacturing thereof that allows, in a device process of a customer, etc., for example, in a film formation process using photoresist material or a multilayer-film formation process, prevention of trouble such as bursting or delamination of the formed film that are caused.

Solution to Problem

To achieve the above object, the present invention provides a method for evaluating an edge shape of a silicon wafer, wherein as shape parameters for evaluating the edge shape in a wafer cross section of the silicon wafer, when defining a position in a radial direction of the wafer at a tip of a chamfered portion of the silicon wafer as a radial direction reference L1, a position in the radial direction of the wafer 450 [μm] inward in a central direction of the wafer from the radial direction reference L1 as a radial direction reference L2, an intersection point of the radial direction reference L2 and a main surface of the wafer as P1, a plane including the point P1 and showing a wafer height position of the point P1 as a height reference plane L3, in the chamfered portion, a point on a surface of the chamfered portion h1 [μm] away from the height reference plane L3 in a vertical direction as Px2, a point on the surface of the chamfered portion h2 [μm] away from the height reference plane L3 in a vertical direction as Px3, a straight line that passes through the two points, the point Px2 and the point Px3 as Lx, an acute side angle of an angle between the straight line Lx and the height reference plane L3 as θx, an intersection point of the straight line Lx and the height reference plane L3 as Px0, a position on a surface of the wafer δ [μm] inward in a central direction of the wafer from the point Px0 as point Px1, and a radius of a circle that passes through the three points, the point Px1, the point Px2, and the point Px3 as Rx [μm], the edge shape of the silicon wafer is measured, values of the shape parameters h1, h2, and δ are set, the shape parameters Rx and θx are calculated in accordance with the definition based on measurement data of the edge shape, and the edge shape of the silicon wafer is determined from the calculated Rx and θx to be evaluated.

By evaluating the shape of a wafer edge portion based on new definitions as described above with the inventive method for evaluating as described, edge shapes of the silicon wafer in portions that had not been defined by conventional technology and evaluating method, that is, the shape of the boundary region between the main surface and the chamfered portion can be determined in detail. In addition, whatever surface width the chamfered shape has, the above shape of the boundary region can be determined in detail.

The aforementioned trouble, that is, for example bursting of a photoresist film or delamination of an oxide film, poor detection by a sensor, etc. occurs, due to the shape of the above-described boundary region. However, according to the inventive method for evaluating, the above shape of the boundary region can be determined and evaluated in detail, and in addition, can be controlled, and for example, from the relationship between the determined result and the occurrence of the above trouble, a shape of the boundary region most suitable for preventing trouble can be obtained. In this way, the above-described trouble can be prevented from occurring.

The present invention further provides a method for selecting a silicon wafer, wherein the edge shape of the silicon wafer is determined by the above method for evaluating an edge shape of a silicon wafer, and based on the determined result, the silicon wafer is selected.

By such a selection method, for example, a silicon wafer that has a desired shape in the above boundary region capable of preventing the occurrence of the above trouble can be selected with certainty and simplicity.

The present invention further provides a method for manufacturing a silicon wafer, wherein the edge shape of the silicon wafer is determined by the above method for evaluating an edge shape of a silicon wafer, and a silicon wafer to be manufactured subsequently is manufactured with the shape parameters set based on the determined result.

According to such a manufacturing method, by feedback of data concerning the edge shape to the wafer manufacturing, for example, a silicon wafer that has the most suitable shape in the above boundary region capable of preventing the occurrence of the above trouble can be manufactured with certainty and simplicity.

Further, when determining the edge shape of the silicon wafer, the h1 may be set to 15 [μm], the h2 may be set to 30 [μm], and the δ may be set to 30 [μm], and when setting the shape parameters of the silicon wafer to be manufactured subsequently, the Rx may be set to 240 [μm] or more and the θx may be set to 27 [deg] or less.

In this way, a silicon wafer capable of preventing the above trouble with more certainty can be obtained.

The present invention further provides an apparatus for evaluating an edge shape of a silicon wafer, wherein as shape parameters for evaluating the edge shape in a wafer cross section of the silicon wafer, with definition of a position in a radial direction of the wafer at a tip of a chamfered portion of the silicon wafer as a radial direction reference L1, a position in the radial direction of the wafer 450 [μm] inward in a central direction of the wafer from the radial direction reference L1 as a radial direction reference L2, an intersection point of the radial direction reference L2 and a main surface of the wafer as P1, a plane including the point P1 and showing a wafer height position of the point P1 as a height reference plane L3, in the chamfered portion, a point on a surface of the chamfered portion h1 [μm] away from the height reference plane L3 in a vertical direction as Px2, a point on the surface of the chamfered portion h2 [μm] away from the height reference plane L3 in a vertical direction as Px3, a straight line that passes through the two points, the point Px2 and the point Px3 as Lx, an acute side angle of an angle between the straight line Lx and the height reference plane L3 as θx, an intersection point of the straight line Lx and the height reference plane L3 as Px0, a position on a surface of the wafer δ [μm] inward in a central direction of the wafer from the point Px0 as point Px1, and a radius of a circle that passes through the three points, the point Px1, the point Px2, and the point Px3 as Rx [μm], the apparatus is provided with a measurement means for measuring the edge shape of the silicon wafer and an analysis means for analyzing measurement data of the edge shape obtained by the measurement means, and the analysis means is provided with an input unit for inputting data of values of the shape parameters h1, h2, and δ, a calculation unit for calculating the shape parameters Rx and θx from the data of the values of the h1, the h2, and the δ input into the input unit in accordance with the definition based on the measurement data of the edge shape, and an output unit for outputting data of the Rx and the θx calculated in the calculation unit.

By the inventive evaluation apparatus, the shape of the above boundary region that has conventionally not been defined can be determined and evaluated in detail and controlled. Using this evaluation, for example, a shape of the boundary region capable of preventing the above trouble can be obtained, and it is actually possible to prevent the occurrence of the above trouble.

The present invention further provides a silicon wafer, wherein as shape parameters for evaluating the edge shape in a wafer cross section of the silicon wafer, with definition of a position in a radial direction of the wafer at a tip of a chamfered portion of the silicon wafer as a radial direction reference L1, a position in the radial direction of the wafer 450 [μm] inward in a central direction of the wafer from the radial direction reference L1 as a radial direction reference L2, an intersection point of the radial direction reference L2 and a main surface of the wafer as P1, a plane including the point P1 and showing a wafer height position of the point P1 as a height reference plane L3, in the chamfered portion, a point on a surface of the chamfered portion h1 [μm] away from the height reference plane L3 in a vertical direction as Px2, a point on the surface of the chamfered portion h2 [μm] away from the height reference plane L3 in a vertical direction as Px3, a straight line that passes through the two points, the point Px2 and the point Px3 as Lx, an acute side angle of an angle between the straight line Lx and the height reference plane L3 as θx, an intersection point of the straight line Lx and the height reference plane L3 as Px0, a position on a surface of the wafer δ [μm] inward in a central direction of the wafer from the point Px0 as point Px1, and a radius of a circle that passes through the three points, the point Px1, the point Px2, and the point Px3 as Rx [μm], the h1 is 15 [μm], the h2 is 30 [μm], the δ is 30 [μm], the Rx is 240 [μm] or more, and the θx is 27 [deg] or less.

The inventive silicon wafer as described is a wafer capable of preventing the above trouble with more certainty, and has excellent quality concerning edge shape.

The present invention further provides a method for evaluating an edge shape of a silicon wafer, wherein as shape parameters for evaluating the edge shape in a wafer cross section of the silicon wafer, when defining an arbitrary point on a main surface of the silicon wafer as Px1, two arbitrary points on a surface of a chamfered portion as Px2 and Px3, in a radial direction of the wafer, a point on the main surface a given distance inward in a central direction of the wafer from a tip of the chamfered portion as P1, a plane including the point P1 and showing a wafer height position of the point P1 as a height reference plane L3, a straight line that passes through the two points, the point Px2 and point Px3 as Lx, an acute side angle of an angle between the straight line Lx and the height reference plane L3 as θx, and a radius of a circle that passes through the three points, the point Px1, the point Px2, and the point Px3 as Rx, the edge shape of the silicon wafer is measured, positions of the point Px1, the point Px2, and the point Px3 are set, the shape parameters Rx and θx are calculated in accordance with the definition based on measurement data of the edge shape, and the edge shape of the silicon wafer is determined from the calculated Rx and θx to be evaluated.

By this evaluation method too, the shape of the above boundary region that had conventionally not been defined can be determined and evaluated in detail and controlled, and further, a shape of the boundary region capable of preventing the above trouble can be obtained, and it is actually possible to prevent the occurrence of the above trouble.

The present invention further provides a method for manufacturing a silicon wafer, wherein as shape parameters for evaluating the edge shape in a wafer cross section of the silicon wafer, when defining an arbitrary point on a main surface of the silicon wafer as Px1, two arbitrary points on a surface of a chamfered portion as Px2 and Px3, in a radial direction of the wafer, a point on the main surface a given distance inward in a central direction of the wafer from a tip of the chamfered portion as P1, a plane including the point P1 and showing a wafer height position of the point P1 as a height reference plane L3, a straight line that passes through the two points, the point Px2 and point Px3 as Lx, an acute side angle of an angle between the straight line Lx and the height reference plane L3 as θx, and a radius of a circle that passes through the three points, the point Px1, the point Px2, and the point Px3 as Rx, and when the point Px1 is set, in the radial direction of the wafer, as a point on the main surface in a range of 1000 [μm] or less away from the tip of the chamfered portion in the central direction of the wafer, the point Px2 is set as a point on the surface of the chamfered portion 15 [μm] away from the height reference plane L3 in a vertical direction, and the point Px3 is set as a point on the surface of the chamfered portion 30 [μm] away from the height reference plane L3 in the vertical direction, a silicon wafer wherein the Rx is 240 [μm] or more and the θx is 27 [deg] or less is manufactured.

By this manufacturing method too, a silicon wafer that has the most suitable shape in the above boundary region capable of preventing the occurrence of the above trouble can be manufactured with certainty and simplicity.

The present invention further provides an apparatus for evaluating an edge shape of a silicon wafer, wherein as shape parameters for evaluating the edge shape in a wafer cross section of the silicon wafer, with definition of an arbitrary point on a main surface of the silicon wafer as Px1, two arbitrary points on a surface of a chamfered portion as Px2 and Px3, in a radial direction of the wafer, a point on the main surface a given distance inward in a central direction of the wafer from a tip of the chamfered portion as P1, a plane including the point P1 and showing a wafer height position of the point P1 as a height reference plane L3, a straight line that passes through the two points, the point Px2 and point Px3 as Lx, an acute side angle of an angle between the straight line Lx and the height reference plane L3 as θx, and a radius of a circle that passes through the three points, the point Px1, the point Px2, and the point Px3 as Rx, the apparatus is provided with a measurement means for measuring the edge shape of the silicon wafer and an analysis means for analyzing measurement data of the edge shape obtained by the measurement means, and the analysis means is provided with an input unit for inputting data of positions of the point Px1, the point Px2, and the point Px3, a calculation unit for calculating the shape parameters Rx and θx from the data of the positions of the point Px1, the point Px2, and the point Px3 input into the input unit in accordance with the definition based on the measurement data of the edge shape, and an output unit for outputting data of the Rx and the θx calculated in the calculation unit.

By this evaluation apparatus too, the shape of the above boundary region that had conventionally not been defined can be determined and evaluated in detail and controlled, and further, a shape of the boundary region capable of preventing the above trouble can be obtained, and it is actually possible to prevent the occurrence of the above trouble.

The present invention further provides a silicon wafer, wherein as shape parameters for evaluating the edge shape in a wafer cross section of the silicon wafer, with definition of an arbitrary point on a main surface of the silicon wafer as Px1, two arbitrary points on a surface of a chamfered portion as Px2 and Px3, in a radial direction of the wafer, a point on the main surface a given distance inward in a central direction of the wafer from a tip of the chamfered portion as P1, a plane including the point P1 and showing a wafer height position of the point P1 as a height reference plane L3, a straight line that passes through the two points, the point Px2 and point Px3 as Lx, an acute side angle of an angle between the straight line Lx and the height reference plane L3 as θx, and a radius of a circle that passes through the three points, the point Px1, the point Px2, and the point Px3 as Rx, the point Px1 is a point, in the radial direction of the wafer, on the main surface in a range of 1000 [μm] or less away from the tip of the chamfered portion in the central direction of the wafer, the point Px2 is a point on the surface of the chamfered portion 15 [μm] away from the height reference plane L3 in a vertical direction, the point Px3 is a point on the surface of the chamfered portion 30 [μm] away from the height reference plane L3 in the vertical direction, the Rx is 240 [μm] or more, and the θx is 27 [deg] or less.

Such a silicon wafer is also a wafer capable of preventing the above trouble with more certainty, and has excellent quality concerning edge shape.

Advantageous Effects of Invention

By the inventive method and apparatus for evaluating an edge shape of a silicon wafer, a boundary region between a main surface and a chamfered portion of a wafer can be evaluated in detail, and a silicon wafer that has an edge shape capable of preventing the occurrence of trouble caused by the above boundary region such as bursting of a photoresist film in a device process can be supplied.

Further, by the inventive silicon wafer, a selection method and a manufacturing method thereof, a silicon wafer capable of preventing the above trouble with more certainty and which has excellent quality concerning edge shape can be supplied.

BRIEF DESCRIPTION OF DRAWINGS

FIG. 1 is a schematic diagram showing shape parameters of an edge shape in a cross section of the inventive silicon wafer;

FIG. 2 is a schematic diagram showing an example of the inventive apparatus for evaluating the edge shape of a silicon wafer;

FIG. 3 is a calculation flow diagram for calculation and output of Rx and θx by the software mounted on the inventive evaluation apparatus;

FIG. 4 is a process diagram showing an example of the inventive method for evaluating the edge shape of a silicon wafer;

FIG. 5 is an explanatory diagram showing conventional definitions of the dimensions of a cross sectional shape in a chamfered portion of the silicon wafer;

FIG. 6 is an explanatory diagram of R1 and θ1 in a region of A1 as defined by a conventional technology;

FIG. 7 is an explanatory diagram showing an example of measuring points of a chamfered shape;

FIG. 8 is a flow diagram showing an example of the steps of a method for manufacturing a silicon wafer;

FIG. 9 is a flow diagram showing another example of the steps of a method for manufacturing a silicon wafer;

FIG. 10 is a schematic diagram of an example of a formed chamfering method;

FIG. 11 is a schematic diagram showing shape parameters of an edge shape in a cross section of the inventive silicon wafer in a different embodiment.

DESCRIPTION OF EMBODIMENTS

Hereinafter, the present invention will be described in detail with reference to drawings as an example of embodiment, but the present invention is not limited thereto.

As described above, trouble has occurred in a conventional silicon wafer such as bursting or delamination of a photoresist film or oxide film. The present inventors have diligently studied and found that the above trouble occurs when a shape of a boundary region between a main surface and a chamfered portion of a silicon wafer is not suitable for the flow of photoresist, etc. In addition, the present inventors have found that, due to the above boundary region, poor detection of the wafer edge portion by a positioning sensor when setting the silicon wafer.

Further, more specifically, the present inventors have found that the curvature (Rx) (detailed explanation to follow) of the shape of the above boundary region and the angle of depression (θx) (detailed explanation to follow) looking down on the gradient of the chamfered portion from the silicon wafer main surface are important shape parameters of the edge shape of the wafer cross section, and have completed the present invention.

Firstly, the inventive silicon wafer will be described.

FIG. 1 is a schematic diagram showing shape parameters of an edge shape in a cross section of the inventive silicon wafer. FIG. 1 is, specifically, a cross sectional shape of the main surface side. In FIG. 1, the left-and-right direction is the radial direction of the wafer, and the up-and-down direction is the wafer height direction (thickness direction).

Note that the shape parameters for evaluating this edge shape are described in FIG. 1. The definitions of these shape parameters and the edge shape of the inventive silicon wafer will be described in detail below.

In the cross section of the edge shape 2 of the silicon wafer 1, a position of the tip of the chamfered portion 3 in the radial direction of the wafer is defined as a radial direction reference L1. A position in the radial direction of the wafer 450 [μm] inward in a central direction of the wafer from the radial direction reference L1 is defined as a radial direction reference L2. An intersection point of the radial direction reference L2 and the wafer main surface 4 is defined as P1. A plane that includes the point P1 and shows the wafer height position of the point P1 is defined as a height reference plane L3.

In the chamfered portion 3, a point on the surface of the chamfered portion 3 h1 [μm] away from the height reference plane L3 in a vertical direction is defined as Px2, and a point on the surface of the chamfered portion 3 h2 [μm] away from the height reference plane L3 in a vertical direction is defined as Px3. In addition, a straight line that passes through the two points, the point Px2 and the point Px3 is defined as Lx.

The acute side angle of an angle between the straight line Lx and the height reference plane L3 is defined as θx.

In addition, the intersection point of the straight line Lx and the height reference plane L3 is defined as Px0 (a position X[μm] from the radial direction reference L1 in the central direction of the wafer). A position on the surface of the wafer δ [μm] inward in a central direction of the wafer from the point Px0 is defined as a point Px1. The radius of the circle that passes through the three points, the point Px1, the point Px2, and the point Px3 is defined as Rx [μm].

Note that the definitions of these shape parameters are the same in the inventive evaluation apparatus, evaluation method, selection method, and manufacturing method described below.

In the inventive silicon wafer, h1 is 15 [μm], h2 is 30 [μm], δ is 30 [μm], Rx is 240 [μm] or more, and θx is 27 [deg] or less.

If Rx is too small or θx is too large, surface tension increases when a fluid such as photoresist material flows on the boundary region between the main surface and the chamfered portion of the silicon wafer, and swelling occurs during film formation. The swelling during film formation causes bursting and delamination of a film.

In addition, Rx being too small or θx being too large causes poor detection of the edge portion by a positioning sensor.

However, since Rx and θx are in the above range in the inventive silicon wafer, the occurrence of such trouble can be prevented with certainty.

The examples of trouble in a device process as described above result from the inability to measure and control the shape of the boundary region between the main surface and the chamfered portion of the silicon wafer by a conventional method. Further, precision control of the chamfered portion shape by conventional technology was limited to the region in which A1 or A2 in FIG. 5 is defined, and there was no means of measuring the shape of the boundary region between the main surface and the chamfered portion of the silicon wafer particularly, which is close to the surface side where a circuit of a device is formed, and therefore, precision control was not possible. Furthermore, silicon wafers that are not subjected to precision control of the shape of the boundary region between the main surface and the chamfered portion of the silicon wafer are supplied, and the occurrence of trouble in a device process of a customer could not be prevented.

FIG. 6 shows R1 and θ1 in the region of A1 as defined by a conventional technology. R1 is the radius of the circle that passes through the three points, point P2, point P3, and point P5 in FIG. 5. The angle θ1 is an acute side angle between L6 and the height reference plane L3 in FIG. 5. As can be observed from comparing the conventional definitions in FIG. 6 and the definitions of the present invention in FIG. 1, the present invention can define the shape of the above boundary region in a region obviously closer in the central direction of the wafer than conventional.

Next, the inventive apparatus for evaluating the edge shape of a silicon wafer will be described.

FIG. 2 is a schematic diagram showing an example of the inventive evaluation apparatus. As shown in FIG. 2, the evaluation apparatus 5 is provided with a measurement means 6 for measuring the edge shape of the silicon wafer to be evaluated and an analysis means 7 for analyzing measurement data of the edge shape obtained by the measurement means.

The method for measuring the edge shape in the measurement means 6 is not particularly limited, but for example, it is possible to perform binarization image processing by a general transmitted light system on the image taken in and calculate the dimensions edge shape.

Further, the analysis means 7 is provided with an input unit 8, a calculation unit 9, and an output unit 10.

In the input unit 8, the values of the shape parameters h1, h2, and δ shown in FIG. 1 are data-input. h1, h2, and δ set to desired values beforehand can be input.

In addition, the calculation unit 9 calculates the shape parameters Rx and θx from values of h1, h2, and δ data-input into the input unit 8 in accordance with the definition described with reference to FIG. 1 based on the measurement data of the edge shape obtained by the measurement means 6. A software which has a program and a calculation function based on the definition in FIG. 1 is integrated. Going through the calculation flow shown in FIG. 3, Rx and θx are calculated by the software.

In addition, the output unit 10 data-outputs the Rx and θx.

Note that, as measuring (and evaluating) points, 4 points or 8 points on the wafer surface are generally measured with the notch position as a reference. When measuring 4 points, the 4 points are at 90° intervals including a point near the notch (for example, a point 9° from the notch). When measuring 8 points, the 8 points are at 45° intervals including a point near the notch (for example, a point 9° from the notch). However, measuring points are not limited thereto. In addition, the reason why the point 9° from the notch is set as a measuring point is that there is no chamfered portion in the notch portion, and there is no particular limitation to 9°.

Next, the inventive method for evaluating the edge shape of a silicon wafer will be described. Here, a case where the above evaluation apparatus 5 is used will be described as an example, but the invention is not limited to this case.

FIG. 4 is a process diagram showing an example of the inventive evaluation method. As shown in FIG. 4, in this evaluation method, firstly, the edge shape of the silicon wafer to be evaluated is measured using the measurement means 6, and measurement data of the edge shape is obtained.

Next, the values of the shape parameters h1, h2, and δ are set, and the set values are data-input into the input unit 8 of the analysis means 7. Next, the shape parameters Rx and θx are calculated in accordance with the definition in FIG. 1 based on the measurement data of the edge shape obtained by the measurement means 6, using the calculation unit 9, and the calculated values are data-output by the output unit 10. Next, from the Rx and the θx, the edge shape of the silicon wafer is determined and evaluated.

By this inventive evaluation apparatus and evaluation method, the shape of the boundary region between the main surface and the chamfered portion of the wafer can be determined in detail. In addition, by feedback of such detailed shape data of a boundary region, it is possible to predict and design the shape of a boundary region most suitable for preventing trouble in a device process of a customer described above, and process a wafer edge as designed. In this way, occurrence of the above trouble can be prevented with certainty.

For example, it is possible to determine the edge shape of a silicon wafer that has been already manufactured by the above method and based on the determined result, a silicon wafer which has a desired edge shape can be selected. It is possible to select only the silicon wafer that has an edge shape that fulfils the requirements of the customer from existing silicon wafers with more certainty and simplicity.

In addition, based on the determined result of a silicon wafer that has already been manufactured, the shape parameters of the silicon wafer to be manufactured next can be appropriately set, and by processing and manufacturing the next silicon wafer in accordance with the set values, it is possible to mass-produce silicon wafers that fulfil the requirements of a customer simply.

For the above processing of an edge shape, in FIG. 8 and FIG. 9, a method such as adjustment of conditions of the chamfering (fine) processing performed after the lapping step or after the double-side grinding or a method such as change of the design of the chamfering wheel is possible.

At the time of the feedback of the shape data of the boundary region between the main surface and the chamfered portion of the silicon wafer, the parameters to be referred to are Rx and θx. Into each of the three parameters h1, h2, and δ in the input unit for the measurement data of the inventive evaluation apparatus, for example, the values h1=15 [μm], h2=30 [μm], and δ=30 [μm] are input. In this case, concerning the control limit of Rx and θx, the present inventors have confirmed that the range of Rx≥240 [μm] and θx≤27[deg] is most suitable, and a silicon wafer processed to have the above boundary region shape that fulfils the range can prevent the occurrence of trouble in a device process of a customer, and safety of the device process can be maintained.

Note that the input values of the shape parameters h1, h2, and δ, are only given as examples and do not limit the inventive manufacturing method. The values of h1, h2, and δ can be set according to the requirements of a customer or the desired shape quality each time, and the values of Rx and θx for the next wafer can be determined appropriately.

Hereinafter, the inventive silicon wafer and an evaluation apparatus thereof, and further, an evaluation method and a manufacturing method thereof in a different embodiment will be described.

Even with the silicon wafer and the manufacturing method thereof in the embodiment described in detail below, the wafer can prevent the above trouble with more certainty, having excellent quality concerning edge shape, and such a wafer can be manufactured with certainty and simplicity. In addition, with the evaluation apparatus and the evaluation method of this embodiment, it is also possible to determine the shape of the boundary region between the main surface and the chamfered portion of the wafer in detail, and further, it is possible to predict, design, and process the shape of a boundary region most suitable for preventing the occurrence of the above trouble, and the occurrence of the above trouble can be prevented with certainty.

Firstly, the inventive silicon wafer will be described.

FIG. 11 is a schematic diagram showing shape parameters of an edge shape in a cross section of the inventive silicon wafer in a different embodiment. FIG. 11 is, specifically, a cross sectional shape of the main surface side. In FIG. 11, the left-and-right direction is the radial direction of the wafer, and the up-and-down direction is the wafer height direction (thickness direction). The definitions of these shape parameters, etc. will be described in detail below.

In a cross section of the edge shape 102 of a silicon wafer 101, an arbitrary point on a main surface 104 is defined as Px1, and two arbitrary points on the surface of a chamfered portion 103 as Px2 and Px3. In addition, in a radial direction of the wafer, a point on the main surface 104 a given distance inward in a central direction of the wafer from the tip of the chamfered portion 103 is defined as P1, and a plane including the point P1 and showing the wafer height position of the point P1 as a height reference plane L3.

In addition, a straight line that passes through the two points, the point Px2 and point Px3 is defined as Lx, and an acute side angle of an angle between the straight line Lx and the height reference plane L3 as θx. Further, the radius of the circle that passes through the three points, the point Px1, the point Px2, and the point Px3 is defined as Rx.

Note that the definitions of these shape parameters are the same in the inventive evaluation apparatus, evaluation method, and manufacturing method in the different embodiment.

In the inventive silicon wafer, specifically, the point Px1 is a point, in the radial direction of the wafer, on the main surface in a range of 1000 [μm] or less away from the tip of the chamfered portion in the central direction of the wafer, the point Px2 is a point on the surface of the chamfered portion 15 [μm] away from the height reference plane L3 in a vertical direction, the point Px3 is a point on the surface of the chamfered portion 30 [μm] away from the height reference plane L3 in the vertical direction, the Rx is 240 [μm] or more, and the θx is 27 [deg] or less.

By setting the positions of the point Px1, the point Px2, and the point Px3 as described above, Rx and θx for extremely appropriate evaluation of the shape of the boundary region between the main surface and the chamfered portion can be obtained. In addition, when the values of the Rx and θx are within the above range, an effective silicon wafer capable of preventing the occurrence of the above conventional trouble is obtained.

In addition, the point P1 may be any point on the main surface described above, and can be selected arbitrarily.

In the inventive manufacturing method, the inventive silicon wafer described above, that is, a silicon wafer with the positions of the point Px1, the point Px2, and the point Px3 set as described above, and in which Rx and θx are within the above range is manufactured. It is possible to manufacture the silicon wafer with processing conditions of the edge shape set appropriately so that Rx, and ex go within the above range. For example, in FIG. 8 and FIG. 9, a method such as adjustment of conditions of the chamfering (fine) processing performed after the lapping step or after the double-side grinding or a method such as change of the design of the chamfering wheel is possible.

In addition, the inventive evaluation apparatus is provided with a measurement means for measuring the edge shape of the silicon wafer to be evaluated and an analysis means for analyzing measurement data of the edge shape obtained by the measurement means. Further, the analysis means is provided with an input unit, a calculation unit, and an output unit. The point Px1, the point Px2, the point Px3, the height reference plane L3, the straight line Lx, ex, and Rx are based on the above definitions, and at the time of evaluation, position data of the point Px1, the point Px2, and the point Px3 are input, but other aspects (for example, measuring method of the measurement means, etc.) may be the same as in the evaluation apparatus in FIG. 2.

In the data-input of the position of the point Px1, the position of the point Px1 may be set appropriately first. For example, a point, in the radial direction of the wafer, on the main surface in a range of 1000 [μm] or less away from the tip of the chamfered portion in the central direction of the wafer can be set.

Note that the way in which the position of the point Px1 is set and the distance from the tip are not limited thereto, and may be determined appropriately.

In the data-input of the positions of the point Px2 and the point Px3, the position of the point Px2 and the point Px3 may be set appropriately first. For example, the position of the point P1 (a given distance from the tip of the chamfered portion in the radial direction of the wafer) is set appropriately, and subsequently, the height reference plane L3 is set. Next, as the point Px2 and Px3, points on the chamfered portion surface in positions a desired distance away from the height reference plane L3 in a vertical direction are set, respectively. The desired distance may be input as position data.

Note that the way in which the positions of the point Px2 and the point Px3 are set is not limited thereto, and may be determined appropriately.

In addition, in the inventive evaluation method, for example, the above evaluation apparatus can be used, and at the time of evaluation, the positions of the point Px1, the point Px2, and the point Px3 are set as described above, and Rx and θx are calculated in accordance with the above definitions based on the measurement data of the edge shape, and then, the edge shape of the silicon wafer is determined and evaluated.

EXAMPLES

Hereinafter, the present invention will be described specifically with reference to Examples and Comparative Examples, but the present invention is not limited thereto.

Example 1

Several sample silicon wafers with different edge shapes were prepared and the inventive evaluation method was performed on the samples.

More specifically, firstly, in order to prepare wafers with different shapes of the boundary region between the main surface and the chamfered portion of the wafer, that is, with different Rx and θx as samples, conditions of the chamfering (fine) processing performed after the lapping step or after the double-side grinding step were adjusted or the design of the chamfering wheel used was changed to fabricate the wafers.

Subsequently, with these samples, using the inventive evaluation apparatus 5, the edge shape was measured, values of h1, h2, and δ were set, Rx and θx were calculated in accordance with the definition of the present invention in FIG. 1 based on the measurement data of the edge shape, and the edge shapes were determined and divided.

Note that the data of h1, h2, and δ that were input when calculating Rx and θx were h1=15 [μm], h2=30 [μm], δ=30 [μm], respectively, as shown in Table 1.

In addition, each level of the values of Rx and θx and the fabricated number thereof are as shown in Table 2. Five levels were set for Rx and θx, and ten samples were prepared for each level.

One wafer was extracted from the wafer group of each level after processing was finished, and the values of Rx and θx thereof were representative values of each level. This is shown in Table 3. Note that when several silicon wafers are processed under the same conditions, variation of the values of Rx and θx among the silicon wafers is extremely small, and the values of Rx and θx of the other sample in the level are almost the same as the representative values.

Regarding the data of the representative value Rx and θx in each level of this Table 3, as shown in FIG. 7, each measuring point on the silicon wafer edge portion; 8 points at 45° intervals including a point near the notch (points 9° from the notch) was measured and calculated, and the average value thereof was the representative value of each level.

TABLE 1

| Parameter | Input data |
| --- | --- |
| h1 | 15 |
| h2 | 30 |
| δ | 30 |

TABLE 2

| Level | Rx [μm] | θx [deg] | Number |
| --- | --- | --- | --- |
| A | Rx < 220 | 27 < θx | 10 |
| B | 220 ≤ Rx < 240 | 27 < θx | 10 |
| C | 240 ≤ Rx < 270 | θx ≤ 27 | 10 |
| D | 240 ≤ Rx < 270 | θx ≤ 27 | 10 |
| E | 270 ≤ Rx | θx ≤ 27 | 10 |

TABLE 3

| Level | Rx [μm] | θx [deg] | Number |
| --- | --- | --- | --- |
| A | 219 | 28.0 | 10 |
| B | 232 | 27.2 | 10 |
| C | 246 | 26.7 | 10 |
| D | 253 | 25.3 | 10 |
| E | 280 | 20.4 | 10 |

In this way, by the inventive evaluation apparatus and evaluation method, it is possible to perform a shape evaluation different from a conventional way of evaluation. Unlike in the conventional way, it is possible to obtain shape parameters concerning the boundary region between the main surface and the chamfered portion of the wafer, Rx and θx, and it is possible to perform shape evaluation from a new viewpoint.

Next, after forming a CVD oxide film on the surface of these sample silicon wafers, photoresist was applied, and a curing treatment was performed. After curing the photoresist film, the situation concerning generation of photoresist film defects (bursting of the photoresist film) was confirmed. The results were as shown in Table 4.

Here, when introducing ten samples of each level as a set, if photoresist film defects were generated in even one of the samples, x (unacceptable) has been marked, and when introducing ten samples of each level as a set, if photoresist film defects were generated in none of the ten, ○ (acceptable) has been marked.

TABLE 4

| Level | Rx [μm] | θx [deg] | Number | Number with photoresist film defects generated | Acceptability concerning photoresist film defects |
|---|---|---|---|---|---|
| A | 219 | 28.0 | 10 | 6/10 (60%) | x |
| B | 232 | 27.2 | 10 | 2/10 (20%) | x |
| C | 246 | 26.7 | 10 | 0/10 (0%) | ○ |
| D | 253 | 25.3 | 10 | 0/10 (0%) | ○ |
| E | 280 | 20.4 | 10 | 0/10 (0%) | ○ |

According to the test result shown in Table 4, by using a silicon wafer with the edge shape processed so that the range of Rx is 240 [μm] or more and the range of θx is 27 [deg] or less as in levels C to E, generation of photoresist film defects was avoided.

In this way, by using the inventive evaluation method, conventional trouble can be dissolved.

Example 2

Besides the samples in Example 1, the shapes of several other existing silicon wafers with a diameter of 300 mm were evaluated. That is, evaluation of the edge shape (Rx, θx) was performed on each wafer by the inventive evaluation apparatus and evaluation method with h1=15 [μm], h2, =30 [μm], and δ=30 [μm].

Out of these, those in which Rx is 240 [μm] or more and θx is 27 [deg] or less were selected.

As in Example 1, a photoresist film was formed on a selected wafer, and on checking whether or not photoresist film defects were generated, photoresist film defects had been generated in none. On the other hand, there were wafers in which photoresist film defects were generated among the wafers that were not selected.

Example 3

Based on the results of Example 1, manufacturing of a silicon wafer with a favorable edge shape quality was attempted. Specifically, as shape parameters, h1 was set to 15 [μm], h2 to 30 [μm], δ to 30 [μm], Rx to 240 [μm] or more, and θx to 27[deg] or less. With the processing conditions of Example 1 as a reference, processing conditions were set so that Rx and θx were set to the above values, and based on the set conditions, silicon wafers with the edge shapes processed to have the set Rx and θx were mass-produced.

In addition, when the silicon wafers were introduced into the device process specified by a customer, no trouble such as photoresist film defects occurred.

Besides this, conventional trouble such as oxide film delamination and poor detection of an edge shape by a positioning sensor, etc. were also investigated, but no trouble occurred in any of the silicon wafers mass-produced in the above-described manner. In this way, by controlling the shape parameters concerning the boundary region between the main surface and the chamfered portion of the wafer, it is possible to prevent the occurrence of trouble that could not be prevented conventionally.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for evaluating an edge shape in a wafer cross section of a silicon wafer, wherein, as shape parameters for evaluating the edge shape in the wafer cross section of the silicon wafer, and when defining a position in a radial direction of the silicon wafer at a tip of a chamfered portion of the silicon wafer as a radial direction reference L1, a position in the radial direction of the silicon wafer 450[μm] inward in a central direction of the silicon wafer from the radial direction reference L1 as a radial direction reference L2, an intersection point of the radial direction reference L2 and a main surface of the silicon wafer as an intersection point P1, and a plane including the intersection point P1 and defining a wafer height position of the intersection point P1 as a height reference plane L3:

in the chamfered portion, a point on a surface of the chamfered portion h1[μm] away from the height reference plane L3 in a vertical direction is defined as Px2, a point on the surface of the chamfered portion h2[μm] away from the height reference plane L3 in a vertical direction is defined as Px3, a straight line that passes through two points, the point Px2 and the point Px3, is defined as Lx, an acute side angle of an angle between the straight line Lx and the height reference plane L3 is defined as θx, an intersection point of the straight line Lx and the height reference plane L3 is defined as intersection point Px0, a position on a surface of the silicon wafer δ[μm] inward in a central direction of the silicon wafer from the intersection point Px0 is defined as point Px1, and a radius of a circle that passes through three points, the point Px1, the point Px2, and the point Px3, is defined as Rx[μm], the method comprising:
measuring the edge shape of the silicon wafer;
setting values of the h1, h2, and δ;
calculating the radius of the circle Rx and the acute side angle θx in accordance with the definitions based on the measurement of the edge shape; and
determining the edge shape of the silicon wafer from the calculated radius of the circle Rx and the calculated acute side angle θx to be evaluated.

2. A method for selecting the silicon wafer evaluated according to claim 1, the method comprising selecting the silicon wafer based on the determined edge shape.

3. A method for manufacturing a subsequent silicon wafer, the method comprising:
determining the edge shape of the silicon wafer evaluated according to claim 1; and
manufacturing the subsequent silicon wafer with the shape parameters set based on the determined edge shape.

4. The method for manufacturing the subsequent silicon wafer according to claim 3, wherein, when determining the edge shape of the silicon wafer, the h1 is set to 15[μm], the h2 is set to 30[μm], and the δ is set to 30[μm], and when setting shape parameters of the subsequent silicon wafer, a radius of a circle Rx is set to 240[μm] or more and an acute side angle θx is set to 27[deg] or less.

5. An apparatus for evaluating an edge shape in a wafer cross section of a silicon wafer, wherein, as shape parameters for evaluating the edge shape in the wafer cross section of the silicon wafer, and with definition of a position in a radial direction of the silicon wafer at a tip of a chamfered portion of the silicon wafer as a radial direction reference L1, a position in the radial direction of the silicon wafer 450[μm] inward in a central direction of the silicon wafer from the radial direction reference L1 as a radial direction reference L2, an intersection point of the radial direction reference L2 and a main surface of the silicon wafer as an intersection point P1, and a plane including the intersection point P1 and defining a wafer height position of the intersection point P1 as a height reference plane L3:

in the chamfered portion, a point on a surface of the chamfered portion h1[μm] away from the height reference plane L3 in a vertical direction is defined as Px2, a point on the surface of the chamfered portion h2[μm] away from the height reference plane L3 in a vertical direction is defined as Px3, a straight line that passes through two points, the point Px2 and the point Px3, is defined as Lx, an acute side angle of an angle between the straight line Lx and the height reference plane L3 is defined as θx, an intersection point of the straight line Lx and the height reference plane L3 is defined as intersection point Px0, a position on a surface of the silicon wafer δ[μm] inward in a central direction of the silicon wafer from the intersection point Px0 is defined as point Px1, and a radius of a circle that passes through three points, the point Px1, the point Px2, and the point Px3, is defined as Rx[μm], the apparatus comprising:

a measurement means for measuring the edge shape of the silicon wafer;

an analysis means for analyzing the measured edge shape obtained by the measurement means, the analysis means including an input unit for inputting data of values of the h1, h2, and δ;

a calculation unit for calculating the radius of the circle Rx and the acute side angle θx from the data of the values of the h1, the h2, and the δ input into the input unit in accordance with the definitions based on the measurement of the edge shape; and an output unit for outputting the radius of the circle Rx and the acute side angle θx calculated in the calculation unit.

6. A silicon wafer, wherein, as shape parameters for evaluating an edge shape in a wafer cross section of the silicon wafer, and with definition of a position in a radial direction of the silicon wafer at a tip of a chamfered portion of the silicon wafer as a radial direction reference L1, a position in the radial direction of the silicon wafer 450[μm] inward in a central direction of the silicon wafer from the radial direction reference L1 as a radial direction reference L2, an intersection point of the radial direction reference L2 and a main surface of the silicon wafer as an intersection point P1, and a plane including the intersection point P1 and defining a wafer height position of the intersection point P1 as a height reference plane L3:

in the chamfered portion, a point on a surface of the chamfered portion h1[μm] away from the height reference plane L3 in a vertical direction is defined as Px2, a point on the surface of the chamfered portion h2[μm] away from the height reference plane L3 in a vertical direction is defined as Px3, a straight line that passes through two points, the point Px2 and the point Px3, is defined as Lx, an acute side angle of an angle between the straight line Lx and the height reference plane L3 is defined as θx, an intersection point of the straight line Lx and the height reference plane L3 is defined as intersection point Px0, a position on a surface of the silicon wafer δ[μm] inward in a central direction of the silicon wafer from the intersection point Px0 is defined as point Px1, and a radius of a circle that passes through three points, the point Px1, the point Px2, and the point Px3, is defined as Rx[μm], wherein the h1 is 15[μm], the h2 is 30[μm], the δ is 30[μm], the radius of a circle Rx is 240[μm] or more, and the acute side angle θx is 27[deg] or less.

7. A method for evaluating an edge shape in a wafer cross section of a silicon wafer, wherein, as shape parameters for evaluating the edge shape in the wafer cross section of the silicon wafer, and when defining an arbitrary point on a main surface of the silicon wafer as Px1, two arbitrary points on a surface of a chamfered portion as Px2 and Px3, in a radial direction of the silicon wafer, a point on the main surface a given distance inward in a central direction of the silicon wafer from a tip of the chamfered portion as P1, and a plane including the point P1 and defining a wafer height position of the point P1 as a height reference plane L3:

a straight line that passes through two points, the point Px2 and point Px3, is defined as Lx, an acute side angle of an angle between the straight line Lx and the height reference plane L3 is defined as θx, and a radius of a circle that passes through the three points, the point Px1, the point Px2, and the point Px3, is defined as Rx, the method comprising:

measuring the edge shape of the silicon wafer;

setting positions of the point Px1, the point Px2, and the point Px3;

calculating the radius of the circle Rx and the acute side angle θx in accordance with the definitions based on the measurement of the edge shape; and determining the edge shape of the silicon wafer from the calculated radius of the circle Rx and the calculated acute side angle θx to be evaluated.

8. A method for manufacturing a silicon wafer, wherein, as shape parameters for evaluating an edge shape in a wafer cross section of the silicon wafer, and when defining an arbitrary point on a main surface of the silicon wafer as Px1, two arbitrary points on a surface of a chamfered portion as Px2 and Px3, in a radial direction of the silicon wafer, a point on the main surface a given distance inward in a central direction of the silicon wafer from a tip of the chamfered portion as P1, and a plane including the point P1 and defining a wafer height position of the point P1 as a height reference plane L3:

a straight line that passes through two points, the point Px2 and point Px3, is defined as Lx, an acute side angle of an angle between the straight line Lx and the height reference plane L3 is defined as θx, and a radius of a circle that passes through three points, the point Px1, the point Px2, and the point Px3, is defined as Rx, the method comprising, when the point Px 1 is set, in the radial direction of the silicon wafer, as a point on the main surface in a range of 1000[μm] or less away from the tip of the chamfered portion in the central direction of the silicon wafer, setting the point Px2 as a point on the surface of the chamfered portion 15[μm] away from the height reference plane L3 in a vertical direction, and setting the point Px3 as a point on the surface of the chamfered portion 30[μm] away from the height reference plane L3 in the vertical direction, in order to manufacture the silicon wafer where the radius of a circle Rx is 240[μm] or more and the acute side angle θx is 27[deg] or less.

9. An apparatus for evaluating an edge shape in a wafer cross section of a silicon wafer, wherein, as shape parameters for evaluating the edge shape in the wafer cross section of the silicon wafer, and with definition of an arbitrary point on a main surface of the silicon wafer as Px1, two arbitrary points on a surface of a chamfered portion as Px2 and Px3, in a radial direction of the silicon wafer, a point on the main surface a given distance inward in a central direction of the silicon wafer from a tip of the chamfered portion as P1, and a plane including the point P1 and defining a wafer height position of the point P1 as a height reference plane L3:

a straight line that passes through two points, the point Px2 and point Px3, is defined as Lx, an acute side angle of an angle between the straight line Lx and the height reference plane L3 is defined as θx, and a radius of a circle that passes through three points, the point Px1, the point Px2, and the point Px3, is defined as Rx, the apparatus comprising:

a measurement means for measuring the edge shape of the silicon wafer;

an analysis means for analyzing the measured edge shape obtained by the measurement means, the analysis means including an input unit for inputting data of positions of the point Px1, the point Px2, and the point Px3;

a calculation unit for calculating the radius of the circle Rx and the acute side angle θx from the data of the positions of the point Px1, the point Px2, and the point Px3 input into the input unit in accordance with the definitions based on the measurement of the edge shape; and an output unit for outputting the radius of the circle Rx and the acute side angle θx calculated in the calculation unit.

10. A silicon wafer, wherein, as shape parameters for evaluating an edge shape in a wafer cross section of the silicon wafer, and with definition of an arbitrary point on a main surface of the silicon wafer as Px1, two arbitrary points on a surface of a chamfered portion as Px2 and Px3, in a radial direction of the silicon wafer, a point on the main surface a given distance inward in a central direction of the silicon wafer from a tip of the chamfered portion as P1, and a plane including the point P1 and defining a wafer height position of the point P1 as a height reference plane L3:

a straight line that passes through two points, the point Px2 and point Px3, is defined as Lx, an acute side angle of an angle between the straight line Lx and the height reference plane L3 is defined as θx, and a radius of a circle that passes through three points, the point Px1, the point Px2, and the point Px3, is defined as Rx, wherein the point Px1 is a point, in the radial direction of the silicon wafer, on the main surface in a range of 1000[μm] or less away from the tip of the chamfered portion in the central direction of the silicon wafer, the point Px2 is a point on the surface of the chamfered portion 15[μm] away from the height reference plane L3 in a vertical direction, the point Px3 is a point on the surface of the chamfered portion 30[μm] away from the height reference plane L3 in the vertical direction, the radius of the circle Rx is 240[μm] or more, and the acute side angle θx is 27[deg] or less.

* * * * *